(12) United States Patent
    Lin

(10) Patent No.: US 11,508,648 B2
(45) Date of Patent: Nov. 22, 2022

(54) COUPLING MECHANISMS FOR SUBSTRATES, SEMICONDUCTOR PACKAGES, AND/OR PRINTED CIRCUIT BOARDS

(71) Applicant: Intel Corporation, Santa Clara, CA (US)

(72) Inventor: Si Wen Lin, Fujian (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/976,607

(22) PCT Filed: Jun. 29, 2018

(86) PCT No.: PCT/CN2018/093797
    § 371 (c)(1),
    (2) Date: Aug. 28, 2020

(87) PCT Pub. No.: WO2020/000414
    PCT Pub. Date: Jan. 2, 2020

(65) Prior Publication Data
    US 2021/0118785 A1    Apr. 22, 2021

(51) Int. Cl.
    *H01L 23/495*    (2006.01)
    *H01L 23/498*    (2006.01)
    (Continued)

(52) U.S. Cl.
    CPC .... *H01L 23/49816* (2013.01); *H01L 21/4853* (2013.01); *H01L 24/16* (2013.01); *H01L 2224/16225* (2013.01)

(58) Field of Classification Search
    CPC ........... H01L 23/49816; H01L 21/4853; H01L 24/16; H01L 24/17
    (Continued)

(56) References Cited

U.S. PATENT DOCUMENTS

| | | | |
|---|---|---|---|
| 5,246,880 A | * | 9/1993 | Reele ...................... H01L 24/11 257/E23.021 |
| 5,660,321 A | | 8/1997 | Ishida et al. |

(Continued)

FOREIGN PATENT DOCUMENTS

JP    2006278943    10/2006

OTHER PUBLICATIONS

International Search Report and Written Opinion for International Patent Application No. PCT/CN2018/093797 dated Feb. 27, 2019, 7 pgs.

(Continued)

*Primary Examiner* — Nitin Parekh
(74) *Attorney, Agent, or Firm* — Schwabe, Williamson & Wyatt P.C.

(57) ABSTRACT

Techniques directed to forming and using coupling mechanisms for substrates, semiconductor packages, and/or printed circuit boards are described. One technique includes forming a substrate (205) comprising: first and second interconnect pads ($213_A$, $213_B$) in or on a build-up layer (203); and first and second interconnects ($211_A$, $211_B$) on the first and second interconnect pads ($213_A$, $213_B$). The first interconnect pad ($213_A$) can be located at a lower position than the second interconnect pad ($213_B$) with regard to a z-position. The techniques described herein can assist with minimizing or eliminating solder ball bridge defects (SBBDs) that may be creating during performance of coupling technique (e.g., a reflow process, etc.).

25 Claims, 13 Drawing Sheets

(51) Int. Cl.
*H01L 21/48* (2006.01)
*H01L 23/00* (2006.01)

(58) Field of Classification Search
USPC .................................................. 257/737, 778
See application file for complete search history.

(56) References Cited

U.S. PATENT DOCUMENTS

| | | | | |
|---|---|---|---|---|
| 5,677,575 | A * | 10/1997 | Maeta | H01L 23/49827 |
| | | | | 257/781 |
| 5,726,502 | A * | 3/1998 | Beddingfield | H01L 23/544 |
| | | | | 257/797 |
| 5,796,169 | A * | 8/1998 | Dockerty | H01L 23/49816 |
| | | | | 257/780 |
| 5,821,625 | A * | 10/1998 | Yoshida | H01L 21/563 |
| | | | | 257/659 |
| 6,121,689 | A * | 9/2000 | Capote | H01L 23/49883 |
| | | | | 257/E21.511 |
| 6,281,046 | B1 | 8/2001 | Lam | |
| 6,351,031 | B1 * | 2/2002 | Iijima | H05K 3/4617 |
| | | | | 257/E23.129 |
| 7,109,583 | B2 * | 9/2006 | Johnson | H01L 23/49811 |
| | | | | 257/E21.511 |
| 8,624,382 | B2 * | 1/2014 | Tseng | H01L 21/4857 |
| | | | | 257/737 |
| 2004/0104476 | A1 * | 6/2004 | Iwamoto | H01L 24/29 |
| | | | | 257/737 |
| 2007/0205520 | A1 * | 9/2007 | Chou | H01L 24/48 |
| | | | | 257/780 |
| 2015/0357276 | A1 * | 12/2015 | Shimizu | H01L 23/49827 |
| | | | | 361/783 |
| 2016/0020163 | A1 * | 1/2016 | Shimizu | H05K 1/115 |
| | | | | 361/768 |
| 2016/0126172 | A1 * | 5/2016 | Yamamoto | H01L 23/49833 |
| | | | | 257/737 |
| 2017/0263545 | A1 * | 9/2017 | Tsukamoto | H01L 23/49822 |
| 2017/0352628 | A1 * | 12/2017 | Furuichi | H01L 23/562 |
| 2018/0053715 | A1 * | 2/2018 | Ishihara | H01L 23/49822 |
| 2018/0151495 | A1 | 5/2018 | Hsu et al. | |
| 2018/0286797 | A1 * | 10/2018 | Goh | H01L 21/486 |

OTHER PUBLICATIONS

International Preliminary Report on Patentability for International Patent Application No. PCT/CN2018/093797, dated Jan. 7, 2021, 5 pgs.

* cited by examiner

COUPLING MECHANISMS FOR SUBSTRATES, SEMICONDUCTOR PACKAGES, AND/OR PRINTED CIRCUIT BOARDS

CROSS-REFERENCE TO RELATED APPLICATION

This patent application is a U.S. National Phase Application under 35 U.S.C. § 371 of International Application No. PCT/CN2018/093797, filed Jun. 29, 2018, entitled "COUPLING MECHANISMS FOR SUBSTRATES, SEMICONDUCTOR PACKAGES, AND/OR PRINTED CIRCUIT BOARDS," which designates the United States of America, the entire disclosure of which is hereby incorporated by reference in its entirety and for all purposes.

TECHNICAL FIELD

Embodiments of the present disclosure relate to electronics packaging, and more particularly, to interconnect architectures for reducing solder ball bridge defects (SBBDs).

BACKGROUND

Fabricating semiconductor packages or packaged systems typically includes coupling (e.g., physically coupling, electrically coupling, etc.) substrates to each other using one or more coupling techniques. One example of a coupling technique is reflow soldering. Reflow soldering typically includes subjecting the entire assembly to controlled heat. The heat melts the solder to bond the contact pads to each other.

As is known, reflow soldering may cause warpage of one or more components of a semiconductor package. This warpage may result in a solder ball bridge defect (SBBD), which produces undesired short circuits in the semiconductor package. SBBDs can affect one or more levels in the interconnect hierarchy (e.g., a first-level interconnect (FLI), a middle level interconnect (MLI), a second level interconnect (SLI), etc.).

One proposal for avoiding the SBBD described above is to provide restrictive design criteria for fabricating semiconductor packages. Such design criteria includes: (i) making corresponding solder mounting pads of two components co-planar with each other in order to make the interconnection more resilient to defects that may occur during reflow soldering; (ii) minimizing a size of a specific area of a component (e.g., an interposer, a package substrate, a PCB, etc.) that is susceptible to defects that may occur during reflow soldering; and (iii) using a flattening process that includes use of an air press to modify characteristics (e.g., shape, etc.) of a component to make the component more resilient to defects that may occur during reflow soldering.

Time and resources must be dedicated to determining the restrictive design criteria described above, which can increase costs of fabricating semiconductor packages or packaged systems. Furthermore, inclusion of additional processing operations (e.g., a flattening process, etc.) increases assembly costs and complexity.

EMBODIMENTS OF THE PRESENT DISCLOSURE

Described in embodiments herein are electronic systems for interconnect architectures that minimize solder ball bridge defects (SBBDs) and methods of forming such systems. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, warpage of substrates is known to result in solder ball bridge defects (SBBDs). Accordingly, embodiments disclosed herein include interconnect architectures for reducing SBBDs by forming non-uniform interconnect pads. For example, embodiments may include first interconnect pads and second interconnect pads that are formed at different Z-positions. By forming the interconnect pads at different Z-positions, the anticipated warpage can be accommodated, thereby reducing the potential for SBBDs. Accordingly, time and resources do not have to be expended on determining restrictive design criteria for preventing SBBDs, which can in turn avoid investment in specialized equipment or processes that may be required to fabricate systems in accordance with the restrictive design criteria. For yet another example, additional processing operations (e.g., a flattening process, etc.) do not have to be added to the assembly or substrate process flow. As such, assembly or substrate of the system is simplified.

As disclosed herein, the improved interconnect architecture is explicitly described with respect to middle level interconnects (MLIs) for patch on interposer (PoINT) systems. However, it is to be appreciated that embodiments are not limited to this specific interconnect. For example, embodiments described herein may also be applicable to one or more levels in the interconnect hierarchy (e.g., first level interconnects (FLIs), MLIs, second level interconnects (SLIs), etc.) for any electronic package system.

Figure 1A:
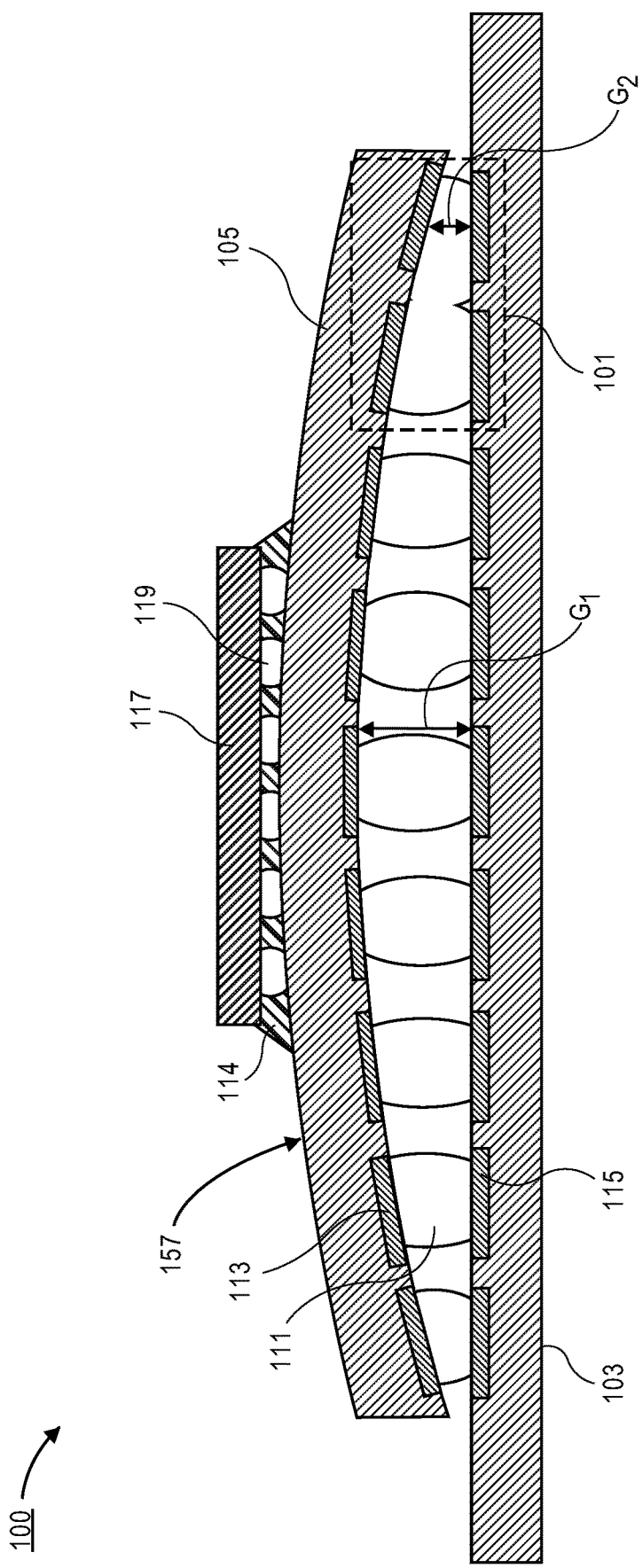
FIG. 1A is a cross-sectional illustration of a patch on interposer (PoINT) assembly that is warped in a convex direction and includes a solder ball bridge defect (SBBD).

Referring now to FIG. 1A, a cross-sectional illustration of an exemplary PoINT system 100 is shown. In the illustrated embodiment, a die 117 is coupled to a patch substrate 105 (e.g., with solder bumps 119 and underfill 114). The patch substrate 105 may be coupled to an interposer 103 with solder bumps 111. In the illustration, the solder bumps 111 couple interconnect pads 113 on the patch substrate 105 to interconnect pads 115 on the interposer 103.

Figure 1B:
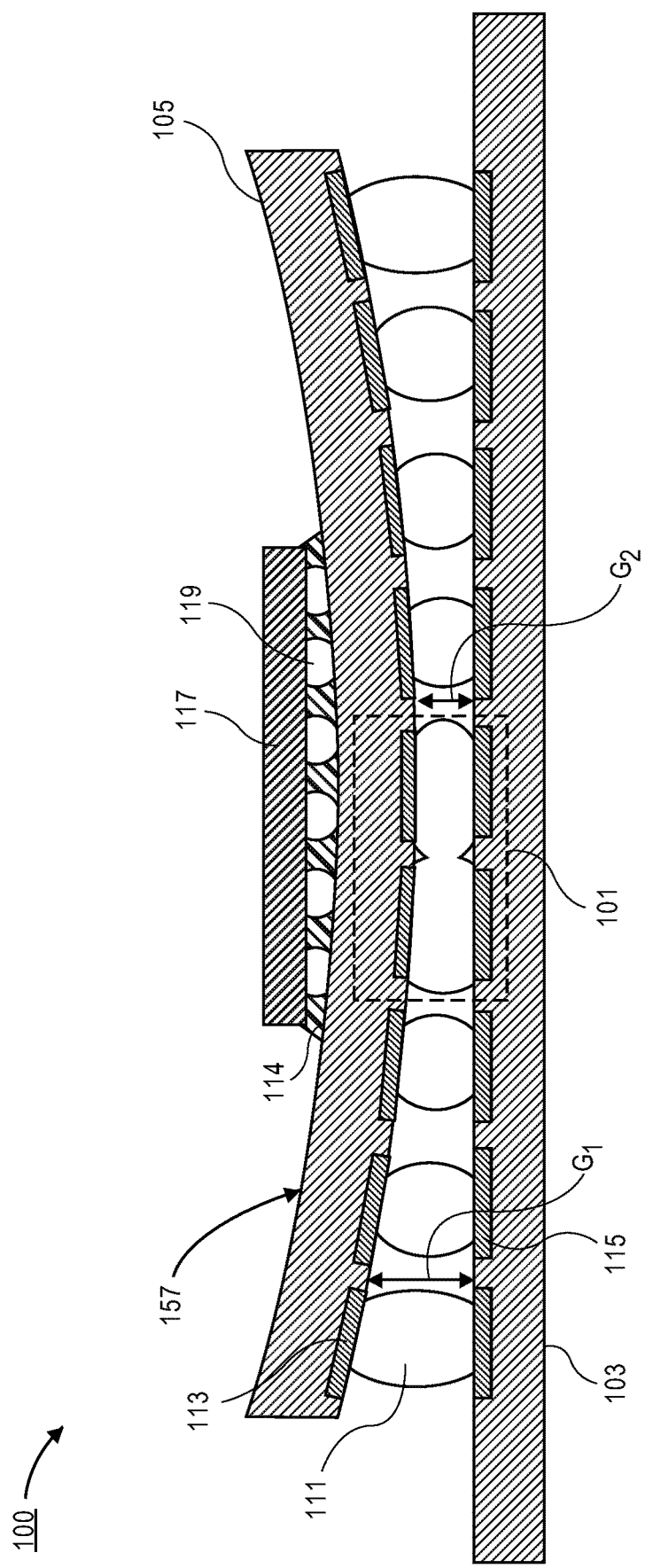
FIG. 1B is a cross-sectional illustration of a patch on interposer (PoINT) assembly that is warped in a concave direction and includes a solder ball bridge defect (SBBD).

As noted above, the reflow process used to form the solder connection between the patch substrate 105 and the interposer 103 results in warpage 157 of the patch substrate 105. Particularly, the warpage 157 in FIG. 1A is shown as being a convex warpage. Depending on the materials used in the PoINT system 100, the warpage 157 may also form in other directions (e.g., concave, etc., or in more than one direction (e.g., concave and convex). For example, and as shown in FIG. 1B, the warpage 157 is shown as a concave warpage. It is to be appreciated that the descriptions provided herein with regard to FIG. 1A are also applicable to FIG. 1B.

With regard again to FIG. 1A, the warpage 157 results in a variable gap G between the patch substrate 105 and the interposer 103. For example, the gap $G_1$ at the center of the patch substrate 105 is larger than the gap $G_2$ near the edge of the patch substrate 105. Accordingly, there is less room for the solder balls 111 during reflow. This may result in SBBDs 101, as shown in FIG. 1.

Accordingly, embodiments disclosed herein include interconnect pads that are positioned at non-uniform positions (in the Z-direction). At least one advantage of the embodiments described herein is assisting with reducing or eliminating SBBDs. For example, positioning interconnect pads at non-uniform positions on a substrate (e.g., the patch substrate 105, the interposer 103, the like, etc.) enables forming interconnects (e.g., solder bumps, conductive pillars, solder balls, etc.) characterized by non-uniform volumes and/or stand-off heights on the interconnect pads during performance of a coupling technique (e.g., reflow soldering, etc.). The formed interconnects, which are characterized by non-uniform volumes and/or stand-off heights, can assist with reducing or eliminating creation of SBBDs during performance of a coupling technique (e.g., reflow soldering, etc.).

The exemplary PoINT system 100, as shown in FIGS. 1A-1B, lacks the advantages provided by at least one of the embodiments described herein—e.g., the advantage described above, which is attributable to designing interconnect pads at non-uniform positions on a substrate.

Figure 2A:
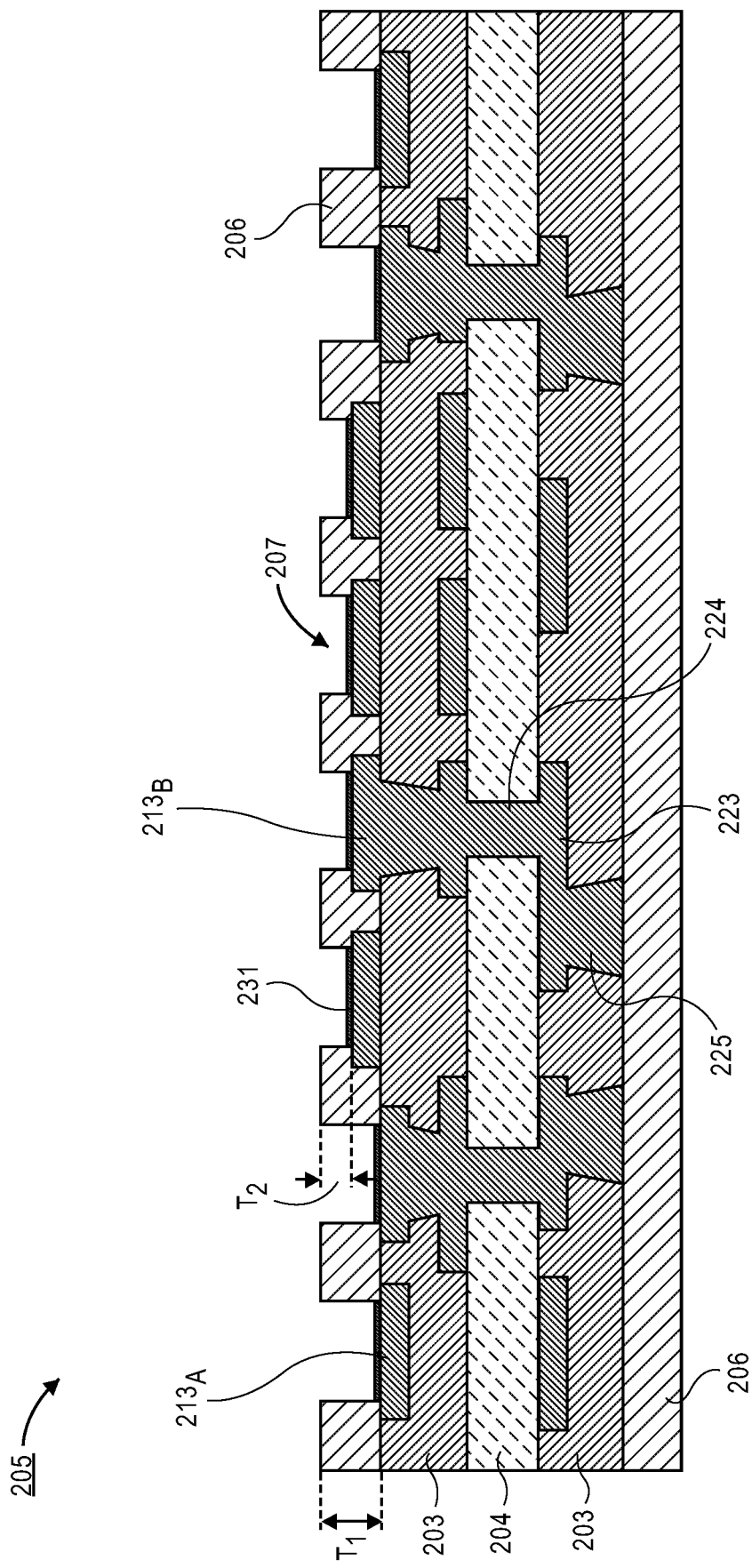
FIG. 2A is a cross-sectional illustration of a patch substrate that comprises first interconnect pads and second interconnect pads, where the first interconnect pads are at a different vertical position than the second interconnect pads, in accordance with an embodiment.

Referring now to FIG. 2A, a cross-sectional illustration of a patch substrate 205 is shown, in accordance with an embodiment. In an embodiment, the patch substrate 205 may include a plurality of build-up layers 203. In the illustrated embodiment, the patch substrate 105 also comprises a core layer 204. However, it is to be appreciated that embodiments may include a patch substrate 205 that is coreless. In an embodiment, the patch substrate 205 may comprise a plurality of conductive traces/pads 223, vias 225, and through-core vias 224. In an embodiment, the conductive features may comprise any suitable conductive material, such as copper or the like. While not shown in FIG. 2A for simplicity, it is to be appreciated that the patch substrate 205 may also comprise embedded features, such as discrete passive devices, active devices, or the like.

In an embodiment, the patch substrate 205 may comprise a plurality of interconnect pads 213. In an embodiment, the interconnect pads 213 may be at locations where an interconnect feature (e.g., a solder bump, a copper pillar, a copper core solder, or the like) is to be formed. In some embodiments, a surface finish 231 may be formed over or on a surface of the interconnect pads 213. While the interconnect pads 213 are referred to as "pads", it is to be appreciated that interconnect pads 213 may refer to any conductive feature (e.g., a trace or the like) on which an interconnect feature is disposed. Furthermore, while the interconnect pads 213 are shown as being on a single surface of the patch substrate 205, it is to be appreciated that embodiments may include interconnect pads 213 formed on either surface or both surfaces of the patch substrate 205.

In an embodiment, the patch substrate 205 may also comprise a solder resist 206 formed over or on one or both surfaces, as is known in the art. In an embodiment, a plurality of solder resist openings 207 may be formed into the solder resist 206 in order to expose portions of the interconnect pads 213.

In an embodiment, the interconnect pads 213 may comprise first interconnect pads $213_A$ and second interconnect pads $213_B$. In an embodiment, the first interconnect pads $213_A$ and the second interconnect pads $213_B$ may have a non-uniform position with respect to a Z-position within the patch substrate. For example, the first interconnect pads $213_A$ may be formed below the second interconnect pads $213_B$. In a particular embodiment, the first interconnect pads $213_A$ may be formed in a build-up layer 203 (e.g., top surfaces of the first interconnect pads $213_A$ may be substantially coplanar with a surface of the build-up layer 203) and the second interconnect pads $213_B$ may be formed over or on the build-up layer 203 (e.g., bottom surfaces of the second interconnect pads 213 may be substantially coplanar with a surface of the build-up layer 203). Accordingly, a thickness T of the solder resist 206 over or on the interconnect pads 213 may be non-uniform. For example, the thickness $T_1$ of the solder resist 206 over or on the first interconnect pads $213_A$ may be greater than the thickness $T_2$ of the solder resist 206 over or on the second interconnect pads $213_B$.

By forming the interconnect pads 213 at non-uniform Z-positions within the patch substrate 205, interconnects characterized by non-uniform volumes and/or stand-off heights may be formed between the patch substrate 205 and a second substrate (not shown) to which the patch substrate 205 is coupled. Such interconnects may be formed to accommodate expected deformation of the patch substrate 205 in order to minimize or prevent occurrence of SBBDs. Examples of such interconnects include, but are not limited to, solder bumps, solder balls, conductive pillars, any other suitable interconnect known in the art, or any combination thereof. Additional details about interconnects characterized by non-uniform volumes and/or stand-off heights are provided below in connection with the description of one or more of FIGS. 2B-5.

For example, in the case of a convex warpage (such as the warpage illustrated in FIG. 1), the first interconnect pads $213_A$ may be formed closer to an edge of the patch substrate 205 than the second interconnect pads $213_B$. Accordingly, any warpage or deformation near the edge of the patch substrate 205 may be accounted for by the topography of the interconnect pads 213 and the interconnects that are subsequently formed on the interconnect pads 213. This is, at least in part, because the first interconnect pads $213_A$ are recessed. Accounting for the warpage or deformation neat the edge of the patch substrate 205 can assist with minimizing or eliminating creation of SBBDs during performance of a coupling technique (e.g., a reflow process, etc.). In embodiments where other warpage modes are expected, the position of the first interconnect pads $213_A$ (i.e., the interconnect pads that recessed) may be changed. For example, if concave warpage is expected, then the first interconnect pads $213_A$ may be located closer to center of the patch substrate 205 than the second interconnect pads $213_B$.

Figure 2B:
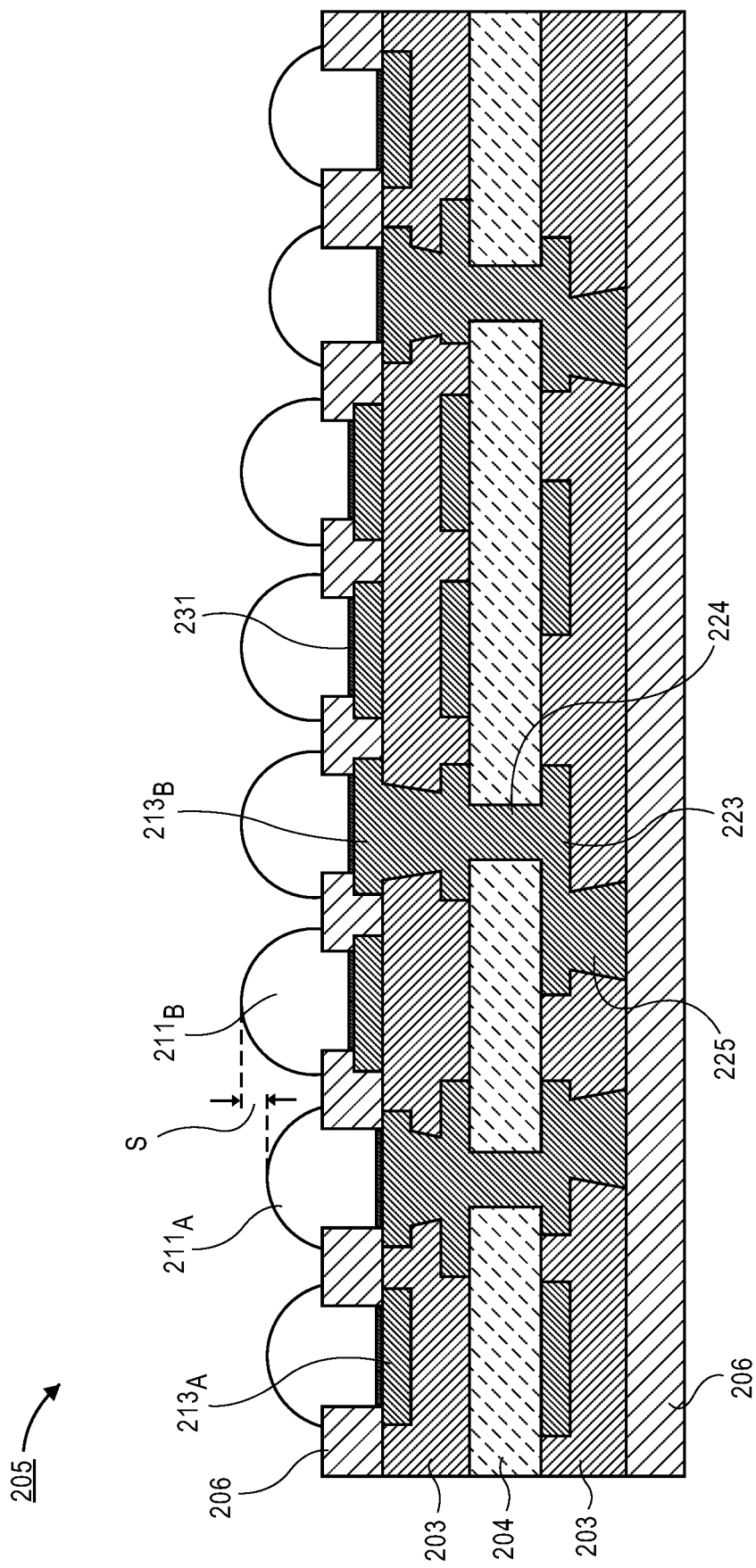
FIG. 2B is a cross-sectional illustration of the patch substrate in FIG. 2A after solder bumps are formed over or on the first interconnect pads and the second interconnect pads, in accordance with an embodiment.

Referring now to FIG. 2B, a cross-sectional illustration after interconnects 211, which are characterized by non-uniform volumes and/or stand-off heights, are formed over or on the interconnect pads 213 is shown, in accordance with an embodiment. In the illustrated embodiment, the interconnects 211 are shown as solder bumps. However, it is to be appreciated that the interconnects 211 may be any suitable interconnect (e.g., conductive pillars, copper core solder balls, any other suitable interconnect known in the art, or any combination thereof).

In one or more embodiments, the interconnects 211 may have: (i) a uniform volume and non-uniform stand-off heights; (ii) non-uniform volumes and a uniform stand-off height; or (iii) non-uniform volumes and non-uniform stand-off heights. Accordingly, and in one embodiment, first interconnects $211_A$ formed over or on the first interconnect pads $213_A$ may have a different stand-off height than the second interconnects $211_B$ formed over or on the second interconnect pads $213_B$. In such an embodiment, a difference in stand-off height S may be present between the first interconnects $211_A$ and the second interconnects $211_B$ due to the non-uniform position in the Z-direction of the first interconnect pads $213_A$ and the second interconnect pads $213_B$. For one example, the difference in the stand-off height S may be at least 10 microns (μm). For another example, the difference in the stand-off height S may be no more than 20 μm. For yet another example, the difference in the stand-off height S may range anywhere from 10 μm to 20 μm. In an embodiment, the difference in the stand-off height S between first interconnects $211_A$ and the second interconnects $211_B$ may be suitable for assisting with minimizing or eliminating SBBDs during reflow of the interconnects 211.

Furthermore, while the volume of the interconnects 211 are shown as being substantially uniform, it is to be appreciated that embodiments may include one or more interconnects 211 that have non-uniform interconnect volumes. For example, the first interconnects $211_A$ may have a volume (e.g., a volume of solder, a volume of copper, etc.) that is less than the volume (e.g., a volume of solder, a volume of copper, etc.) of the second interconnects $211_B$. Such an embodiment may further improve the accommodation of warpage of the patch substrate 205.

Figure 2C:
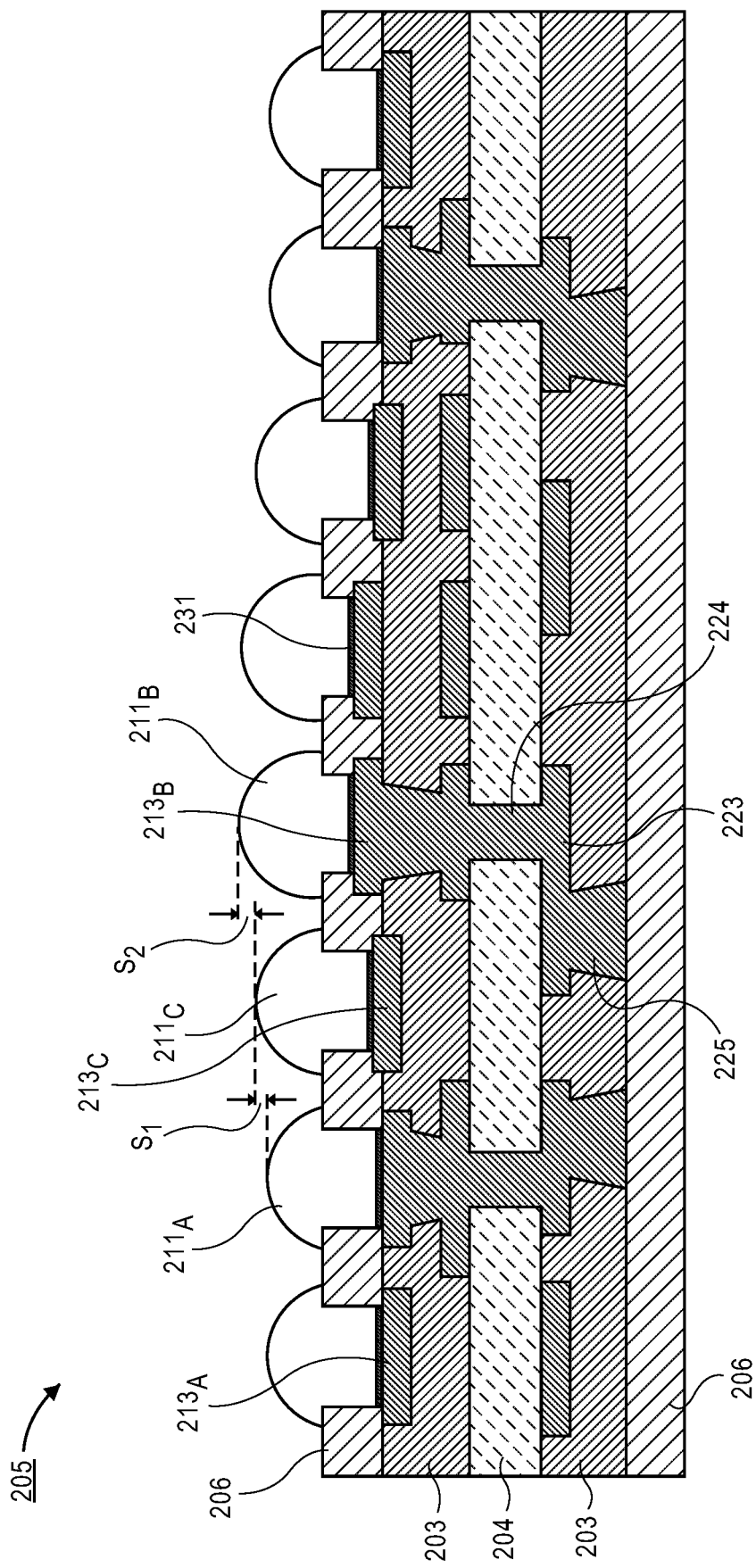
FIG. 2C is a cross-sectional illustration of a patch substrate with first interconnect pads, second interconnect pads, and third interconnect pads, in accordance with an embodiment.

Referring now to FIG. 2C, a cross-sectional illustration of a patch substrate 205 is shown, in accordance with an additional embodiment. The patch substrate 205 may be substantially similar to the patch substrate 205 described above with respect to FIG. 2B, with the exception that interconnect pads 213 are formed at more than two different Z-positions. For example, first interconnect pads $213_A$ may be embedded in the build-up layer 203 (e.g., top surfaces of the first interconnect pads $213_A$ are substantially coplanar with a surface of the build-up layer 203), second interconnect pads $213_B$ may be over or on the build-up layer 203 (e.g., bottom surfaces of the second interconnect pads $213_B$ are substantially coplanar with a surface of the build-up layer 203), and third interconnect pads $213_C$ may be at a Z-position between the first interconnect pads $213_A$ and the second interconnect pads $213_B$. In a particular embodiment, the third interconnect pads $213_C$ may be referred to as embedded (at least partially) in the build-up layer 203. That is, the third interconnect pads $213_C$ may include a top surface that is above the surface of the build-up layer 203 and a bottom surface that is below the surface of the build-up layer.

The use of a patch substrate 205 with interconnect pads 213 at more than two Z-positions provides more accurate matching of the interconnect stand-off height with respect to expected warpage or deformation during reflow. As shown in FIG. 2C, there may be a plurality of different stand-off heights of the interconnects 211. For example, there may be a first difference in stand-off height $S_1$ between the first interconnect $211_A$ and the third interconnect $211_C$, and there may be a second difference in stand-off height $S_2$ between the third interconnect $211_C$ and the second interconnect $211_B$.

Referring now to FIGS. 3A-3F, a series of cross-sectional illustrations provide an example of a process for forming a patch substrate in accordance with embodiments disclosed herein.

Figure 3A:
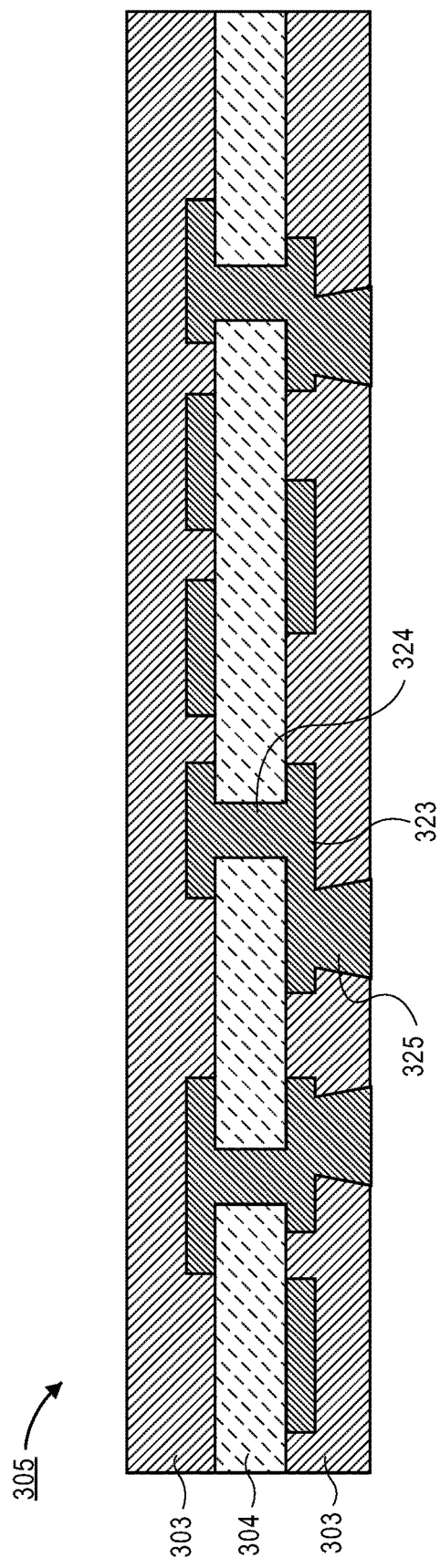
FIG. 3A is a cross-sectional illustration of a patch substrate in accordance with an embodiment.

Referring now to FIG. 3A, a cross-sectional illustration of a patch substrate 305 is shown, in accordance with an embodiment. In an embodiment, the patch substrate 305 may comprise a plurality of build-up layers 303 formed over or on a core 304. However, it is to be appreciated that embodiments disclosed herein may also include a coreless patch substrate 305. In an embodiment, the patch substrate 305 may comprise a plurality of conductive traces/pads 323, vias 325, and through-core vias 324. In an embodiment, the conductive features may be copper or the like. In an embodiment, the build-up layers and the conductive features may be formed with suitable package fabrication processes, such as lamination, laser drilling, lithographic processes, semi-additive processes (SAPs), or the like.

Figure 3B:
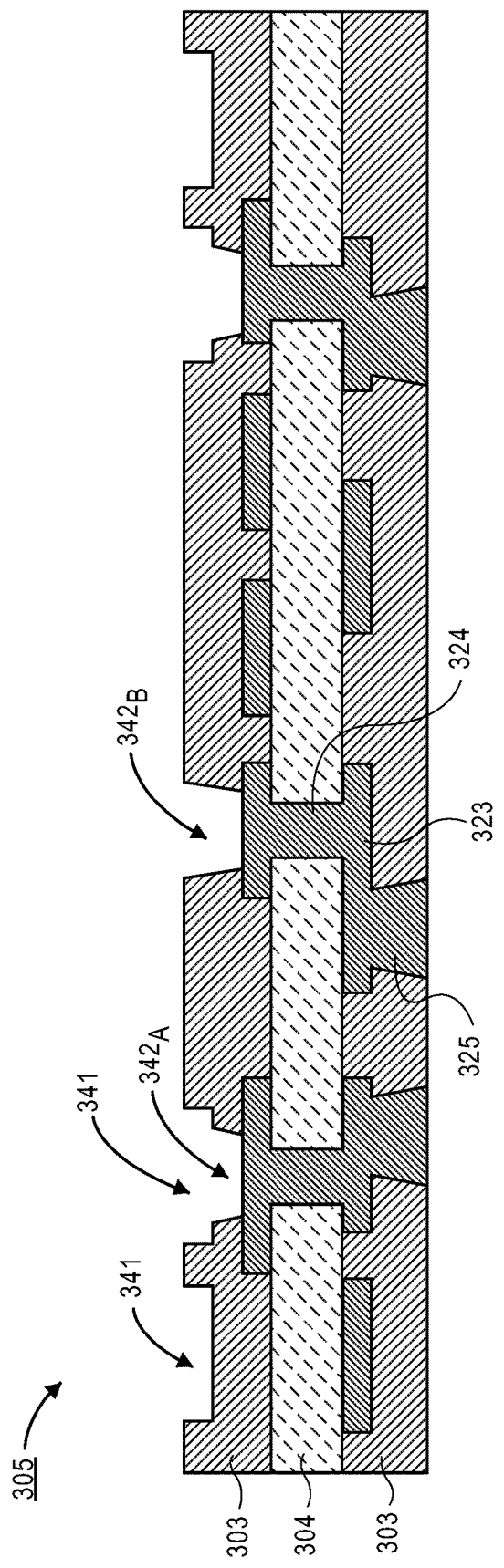
FIG. 3B is a cross-sectional illustration of the patch substrate after recesses and vertical interconnect access (via) openings are formed into the patch substrate, in accordance with an embodiment.

Referring now to FIG. 3B, a cross-sectional illustration is shown after first recesses 341 and underlying via openings 342 are formed, in accordance with an embodiment. In an embodiment, the first recesses 341 and the underlying via openings 342 may be formed with any suitable process. In a particular embodiment, the first recesses 341 and the via openings 342 may be formed with a laser drilling process. The laser drilling process provides control of the depth to which each of the openings are formed.

In an embodiment, the recesses 341 may be located where first interconnect pads are desired to be formed. For example, in systems where a convex warpage is expected, the recesses 341 may be formed proximate to an edge of the patch substrate 305. In embodiments where interconnect pads are formed at more than two Z-positions (e.g., similar to FIG. 2C above), additional recesses may be formed where the second recesses have a different depth than the first recesses.

In an embodiment, the laser drilling process may also be used to form via openings 342 to expose underlying traces and/or pads 323. In an embodiment, the via openings 342 may have non-uniform depths. For example, first via openings $342_A$ formed below the recesses 341 may not be the same depth as second via openings $342_B$ that are not formed below recesses. In an embodiment, a combined depth of the recesses 341 and the first via openings $342_A$ may be substantially the same as a depth of the second via openings $342_B$. In an embodiment, the second via openings $342_B$ may be formed in locations below where second interconnect pads will subsequently formed.

Figure 3C:
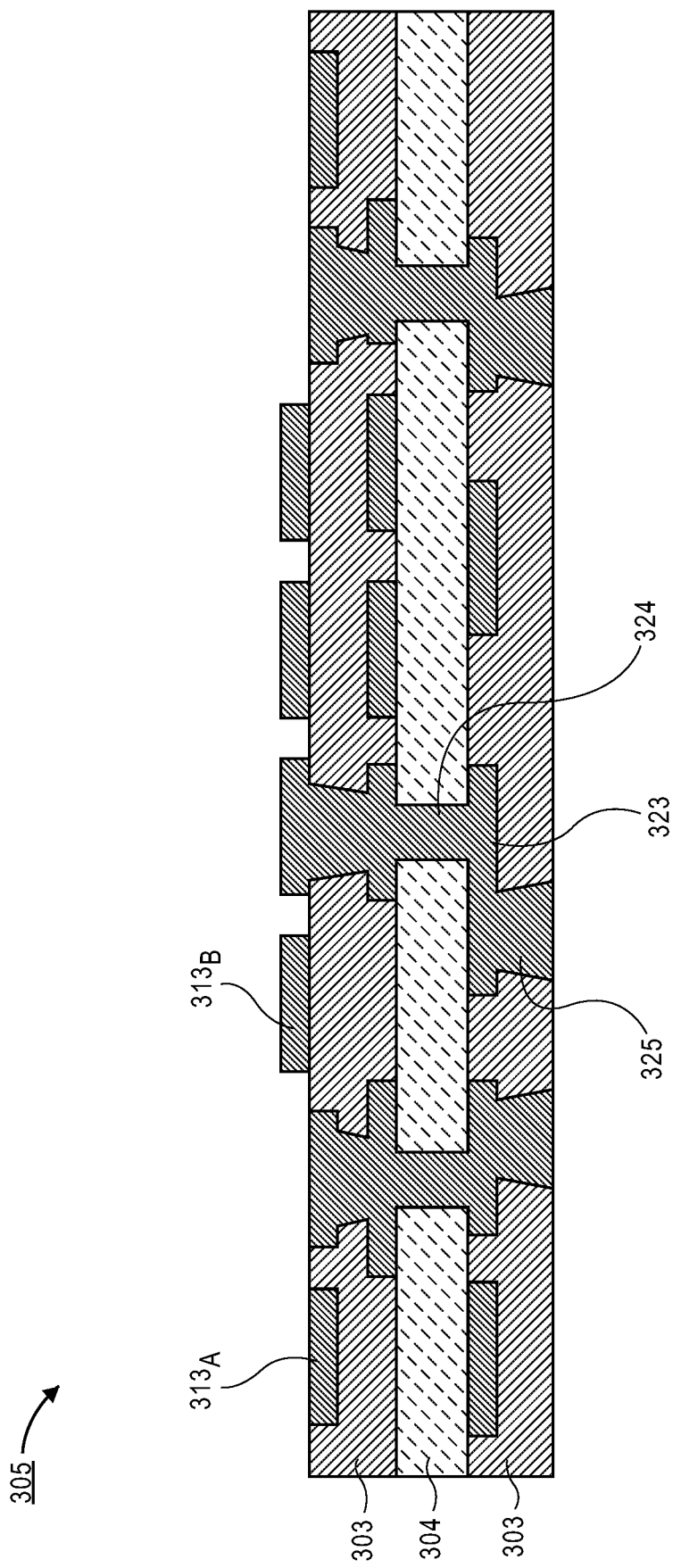
FIG. 3C is a cross-sectional illustration of the patch substrate after first interconnect pads and second interconnect pads are formed, in accordance with an embodiment.

Referring now to FIG. 3C, a cross-sectional illustration after the interconnect pads 313 are formed is shown, in accordance with an embodiment. In an embodiment, the interconnect pads 313 may be formed with any suitable metal deposition process. For example, the interconnect pads 313 may be formed using an SAP that includes formation of a seed layer (not shown) and electrolytic or electroless deposition of conductive material.

In an embodiment, first interconnect pads $313_A$ may be formed at substantially the same time as second interconnect pads $313_B$. For example, the previous formation of the recesses 341 where the first interconnect pads $313_A$ are formed may provide the desired topology that enables the formation of interconnect pads 313 with non-uniform Z-positions. In an embodiment, the first interconnect pads $313_A$ may be embedded within the build-up layer 303 (e.g., top surfaces of the first interconnect pads $313_A$ are substantially coplanar with a surface of the build-up layer), and the second interconnect pads $313_B$ may be formed over or on the build-up layer 303 (e.g., bottom surfaces of the second interconnect pads $313_B$ are substantially coplanar with a surface of the build-up layer 203). While the top surfaces of the first interconnect pads $313_A$ are shown as being substantially coplanar with a surface of the build-up layer 303, it is to be appreciated that top surfaces of the first interconnect pads $313_A$ may be above the surface of the build-up layer 303 so long as the top surfaces of the first interconnect pads $313_A$ are below top surfaces of the second interconnect pads $313_B$.

Figure 3D:
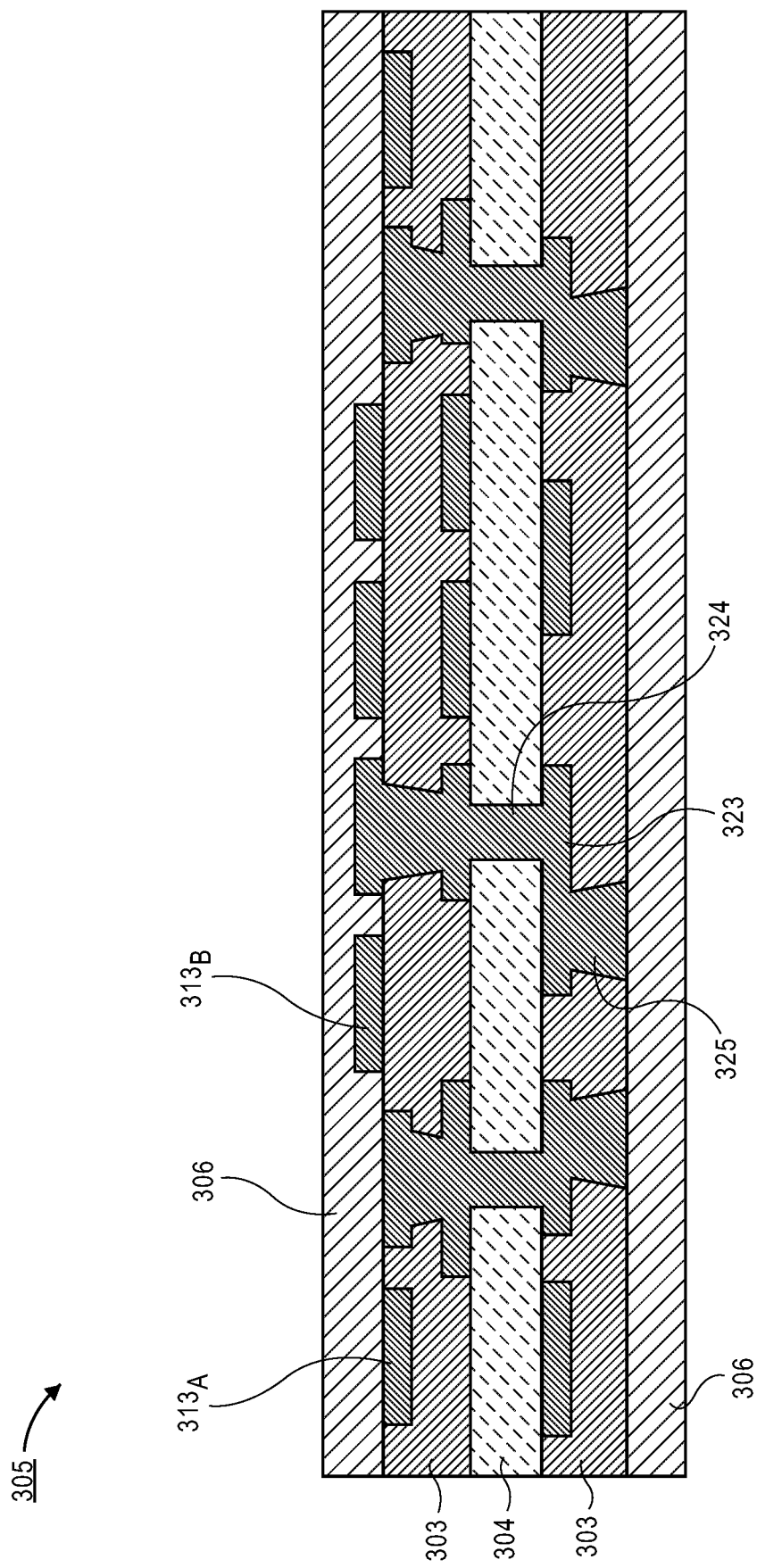
FIG. 3D is a cross-sectional illustration after a solder resist is formed over or on the patch substrate, in accordance with an embodiment.

Referring now to FIG. 3D, a cross-sectional illustration after a solder resist layer 306 is formed over or on surfaces of the patch substrate 305 is shown, in accordance with an embodiment. In an embodiment, the solder resist layer 306 may be formed over or on the surface of the build-up layers 303, the surfaces of the first interconnect pads $313_A$, and the surfaces of the second interconnect pads $313_B$. In an embodiment, the solder resist layer 306 may be deposited with a lamination process, or the like. As shown in FIG. 3D, forming the solder resist layer 306 may include encapsulating surfaces of the build-up layers 303, the first interconnect pads $313_A$, and the second interconnect pads $313_B$. As used herein, the term "encapsulating" means one or more surfaces or portions of a feature or component is covered by a material. Thus, the term "encapsulating" does not require all surfaces or portions of a feature or component to be covered by a material.

Figure 3E:
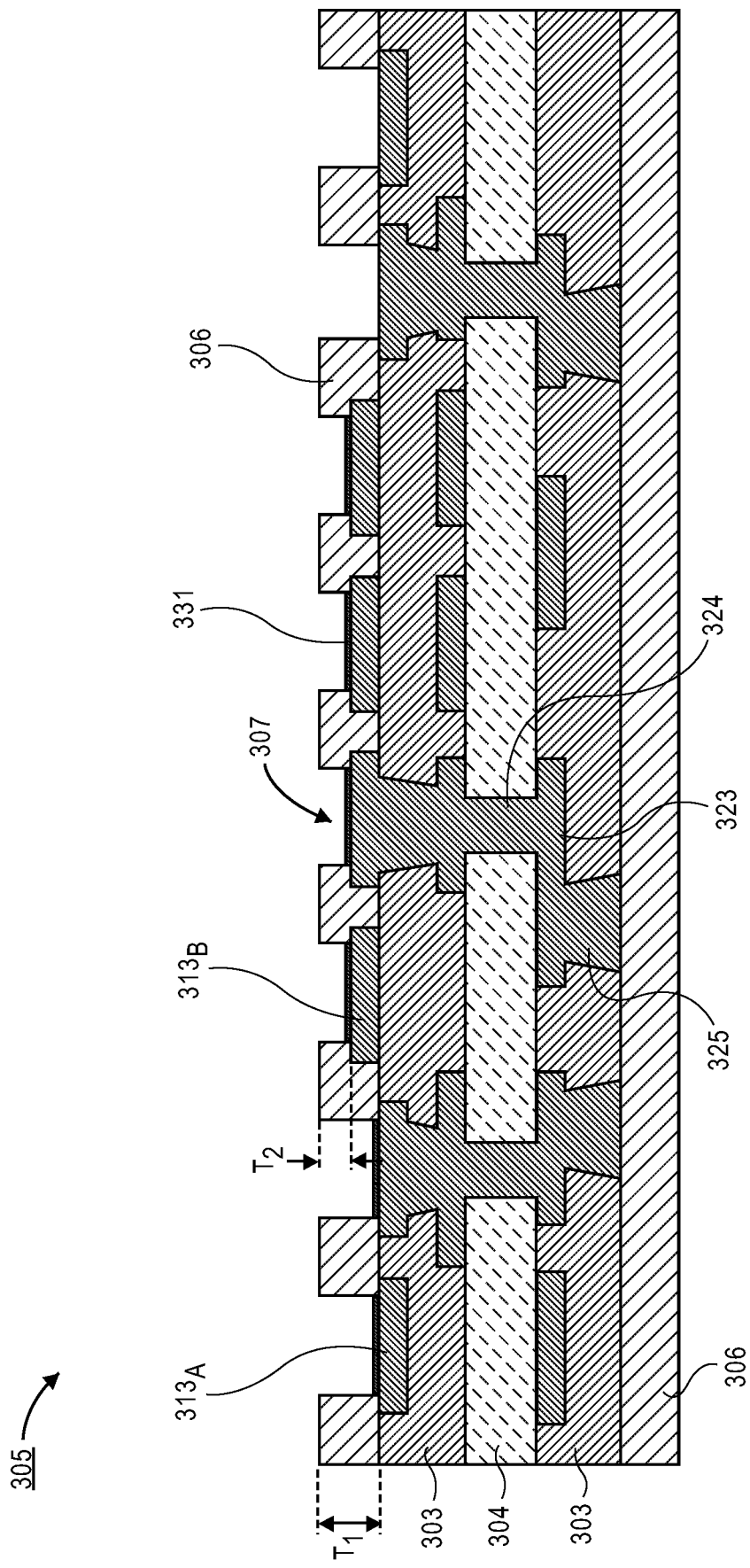
FIG. 3E is a cross-sectional illustration after solder resist openings (SROs) are formed in the solder resist, in accordance with an embodiment.

Referring now to FIG. 3E, a cross-sectional illustration after solder resist openings (SROs) 307 are formed into the solder resist layer is shown, in accordance with an embodiment. In an embodiment, the SROs 307 may be formed with a laser exposure process, or the like. In an embodiment, the SROs 307 may provide openings through the solder resist layer 306 that exposes surfaces or portions of the first interconnect pads $313_A$ and the second interconnect pads $313_B$. In an embodiment, a thickness $T_1$ of the solder resist layer 306 over or on the first interconnect pads $313_A$ may be greater than a thickness $T_2$ of the solder resist layer 306 over or on the second interconnect pads $313_B$. In an embodiment, a surface coating layer 331 may be formed over or on the portions of the first interconnect pads $313_A$ and the second interconnect pads $313_B$ that are exposed by the SROs 307. In an embodiment, the surface coating layer 331 comprises a surface protection layer, a surface finish, or a combination thereof. Examples of a surface protection layer include, but are not limited to, an organic surface protection (OSP) layer, an inorganic surface protection layer, any other suitable surface protection layer known in the art, or any combination thereof. Examples of a surface finish include, but are not limited to, surface finishes formed from organic and/or inorganic materials (e.g., nickel, palladium, silver, platinum, gold, copper, any other suitable material or combination of materials known in the art, etc.).

Figure 3F:
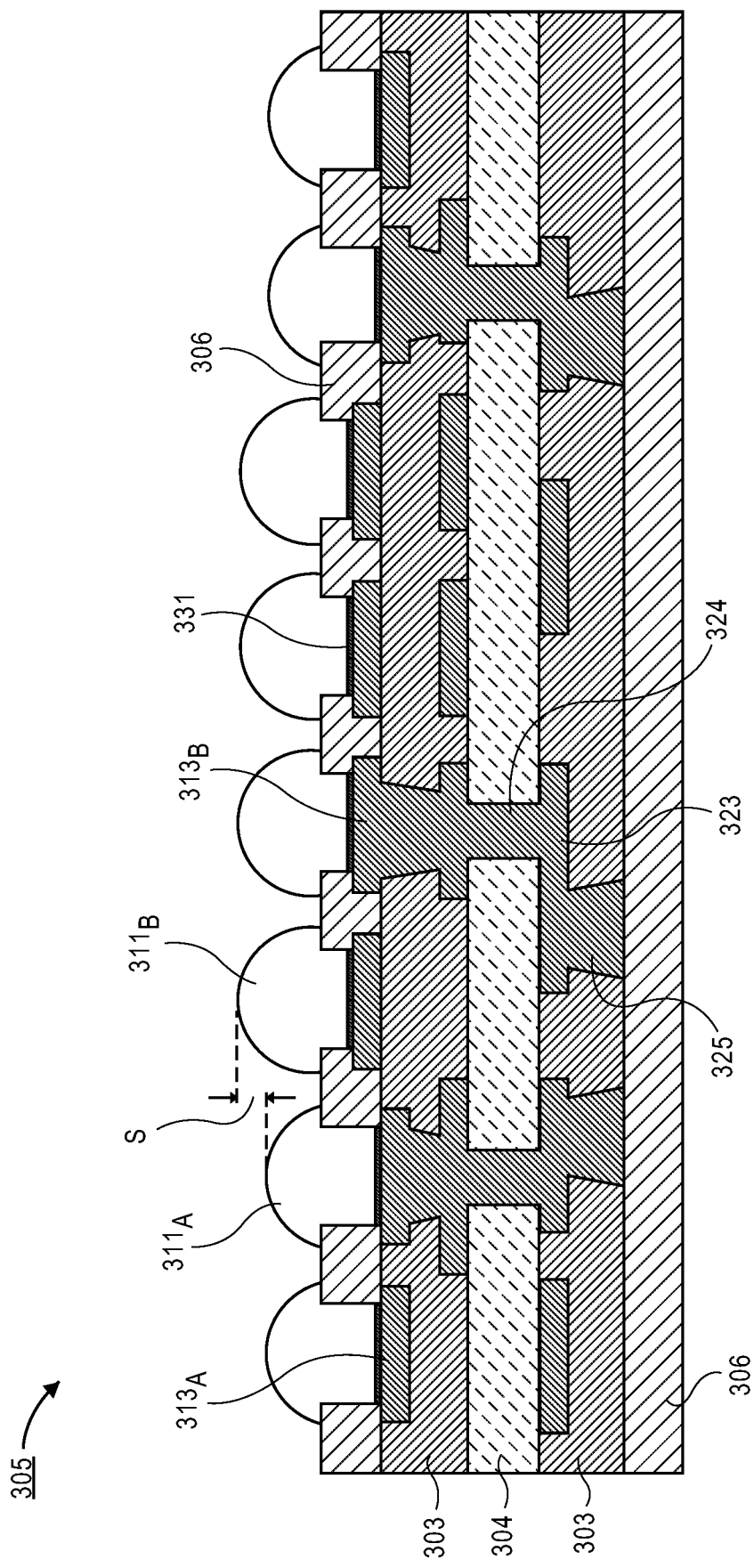
FIG. 3F is a cross-sectional illustration after solder bumps are formed over or on the first interconnect pads and the second interconnect pads, in accordance with an embodiment.

Referring now to FIG. 3F, a cross-sectional illustration after interconnects 311 are formed over or on the interconnect pads 313 is shown, in accordance with an embodiment. In an embodiment, the interconnects 311 may be solder balls. However, embodiments may also include other interconnects, such as conductive pillars, copper core solder balls, or the like. In an embodiment, the interconnects 311 may be formed over or on the interconnect pads 313 with any suitable process, such as printing or the like.

In an embodiment, the interconnects 311 may have a uniform volume. In such embodiments, there may be a difference S in the stand-off height of the first interconnects $311_A$ formed over or on the first interconnect pads $313_A$ and the second interconnects $311_B$ formed over or on the second interconnect pads $313_B$. Such an embodiment may be useful in providing an accommodation for expected warpage or deformation during a reflow process used to couple the patch substrate 305 to a second substrate (not shown). While uniform solder volumes are disclosed, it is to be appreciated that non-uniform solder volumes for the first interconnects $311_A$ and the second interconnects $311_B$ may be used to provide even greater protection from SBBDs.

Figure 4:
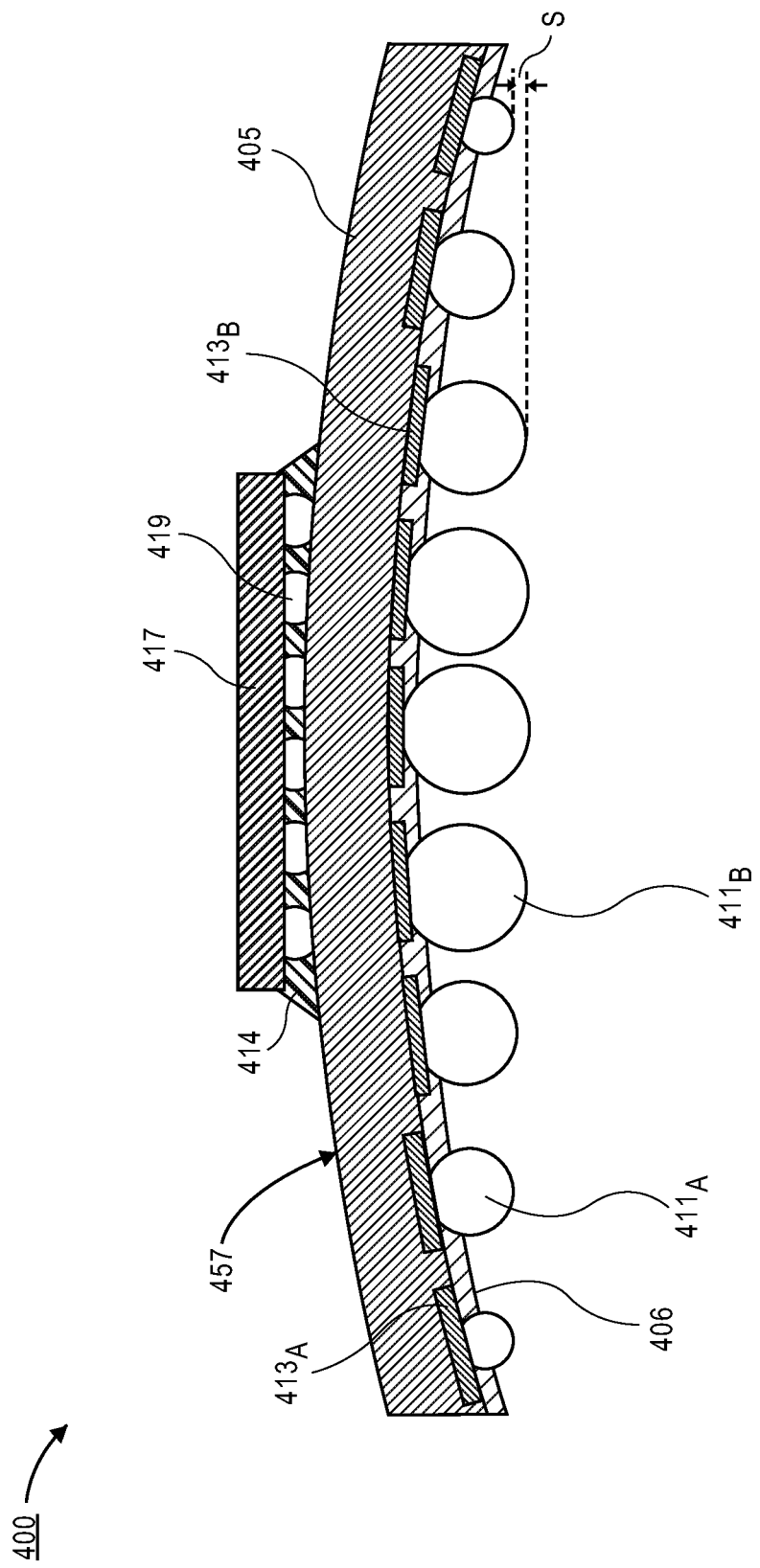
FIG. 4 is a cross-sectional illustration of a die coupled to a warped patch substrate, in accordance with an embodiment.

Referring now to FIG. 4, a cross-sectional illustration of package 400 with a warped patch substrate 405 coupled to a die 417 is shown, in accordance with an embodiment. In an embodiment, the patch substrate 405 is shown with convex warpage 457. In such an embodiment, the first interconnect pads $413_A$ formed proximate to the edge of the patch substrate 405 may be recessed. That is, the first interconnect pads $413_A$ may be embedded (at least partially) in the patch substrate 405 and the second interconnect pads $413_B$ may only be covered by the solder resist layer 406 (e.g., the second interconnect pads $413_B$ may be formed over or on the surface of the patch substrate 405, etc.).

As shown in FIG. 4, the use of non-uniform Z-positions for the first and second interconnect pads $413_A$ and $413_B$ provides for accommodation of the expected warpage 457. Furthermore, the use of non-uniform volumes and/or non-uniform heights may also improve the difference S between the stand-off heights on a warped patch substrate 405. For example, as shown in FIG. 4, the first interconnects $411_A$ have a solder volume that is less than the solder volume used for the second interconnects $411_B$.

Figure 5:
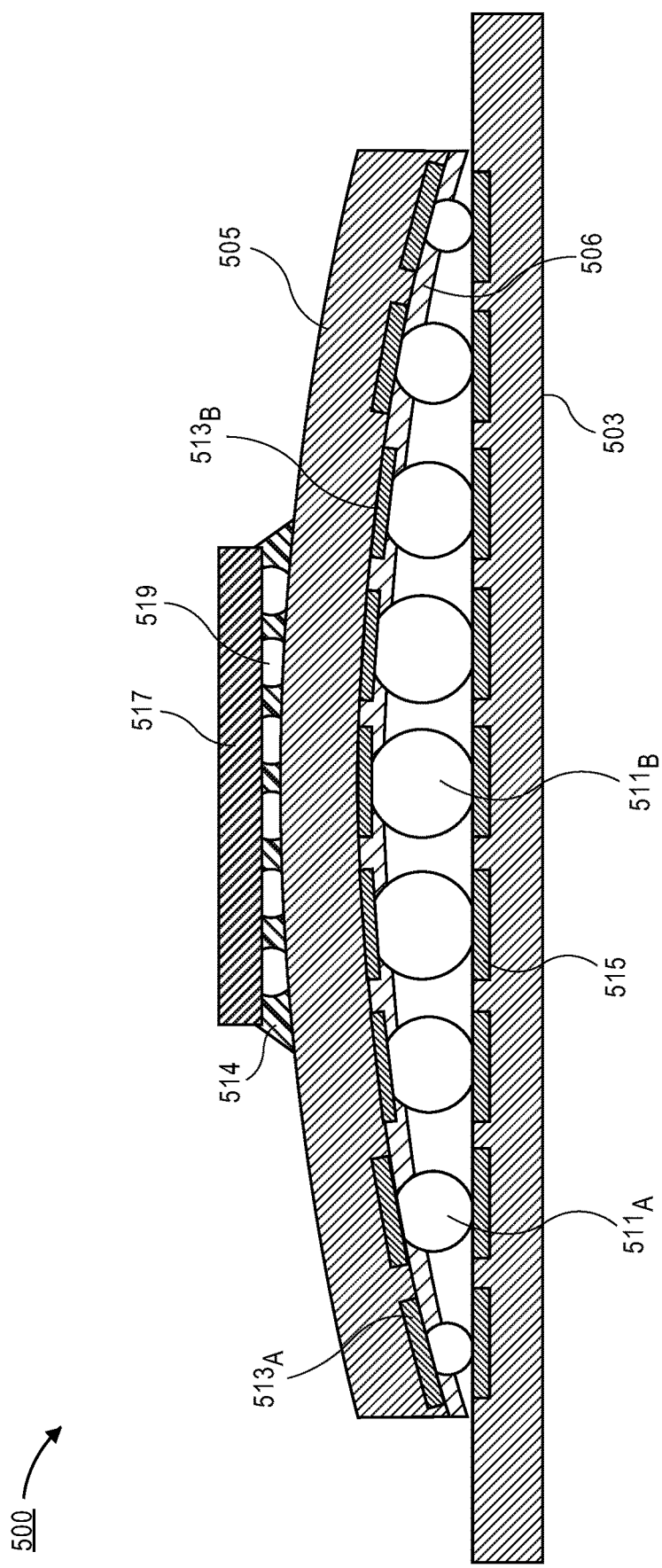
FIG. 5 is a cross-sectional illustration of the warped patch substrate of FIG. 4 coupled to an interposer, in accordance with an embodiment.

Referring now to FIG. 5, a cross-sectional illustration of a package 500 with a patch substrate 505 coupled to an interposer 503 is shown, in accordance with an embodiment. In an embodiment, even with the warpage, the interconnects $511_A$ and $511_B$ do not exhibit a SBBD. In an embodiment, the package 500 may be referred to as a PoINT package 500. For example, the PoINT package 500 may be used in a server, or any other computer system. While FIG. 5 refers to feature 503 as an interposer, it is to be appreciated that patch substrate 505 may be coupled to any substrate known in the art, such as a printed circuit board, a package substrate comprising of at least one metal layer and/or at least one dielectric layer, or any combination thereof. Furthermore, while a single die 517 is illustrated as being coupled to the patch substrate 505 by interconnects and underfill 514, it is to be appreciated than any number of dies 517 may be coupled to the patch substrate 505. Furthermore, some embodiments may include an underfill material (not shown) formed around first and second interconnects $511_A$ and $511_B$. In yet another embodiment, the patch substrate may have interconnect pads $513_A$ and $513_B$ with a non-uniform Z-position over or on both the top surface and the bottom surface in order to accommodate warpage on either surface. Additionally, while the warped substrate 505 is referred to as a patch substrate, it is to be appreciated that embodiments disclosed herein may also apply to interconnect pads and interconnects (e.g., FLIs, MILs, SLIs, or the like) on any substrate (e.g., an interposer, a PCB, or the like).

Figure 6:
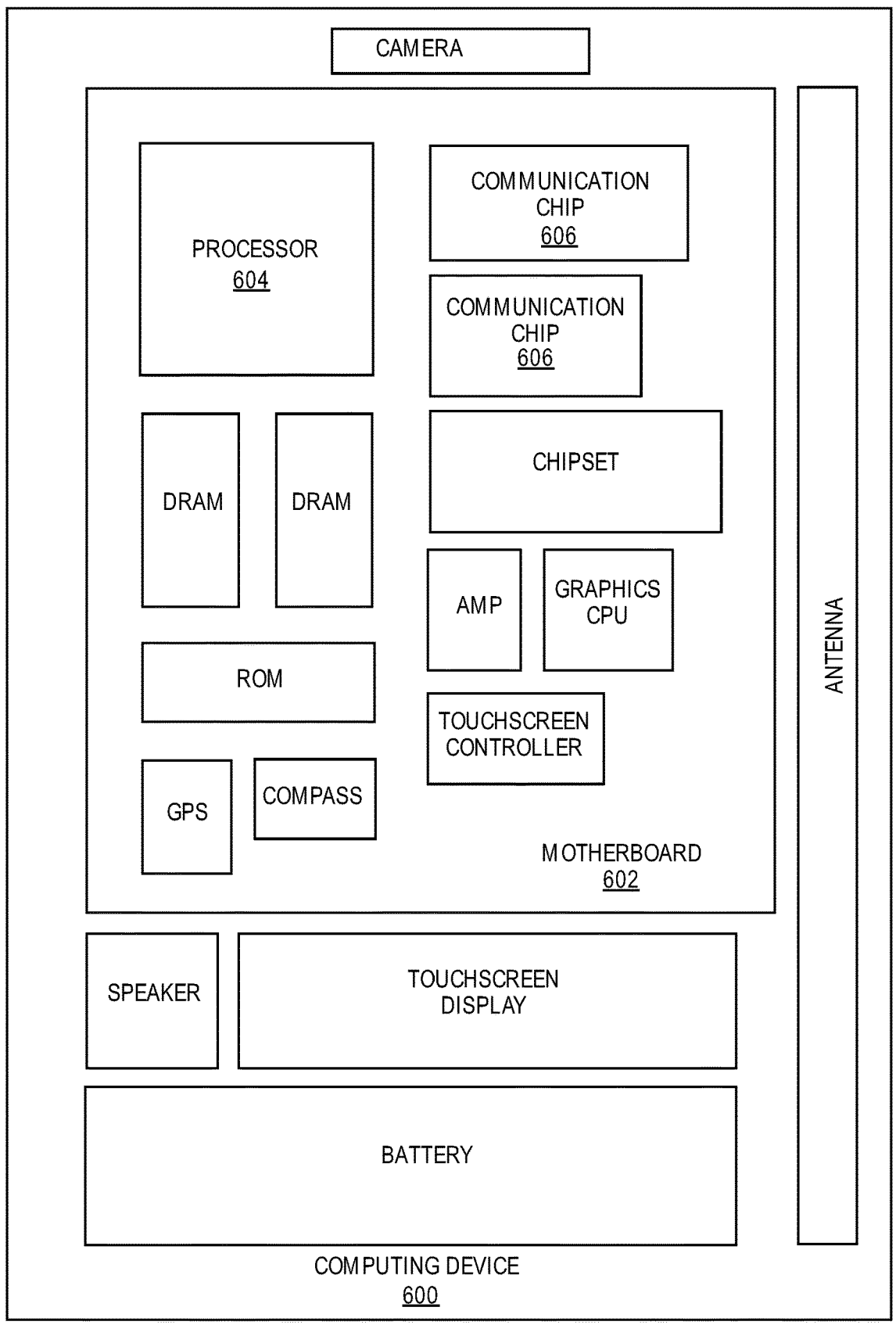
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be communicatively coupled to a patch substrate that comprises first interconnect pads and second interconnect pads at a non-uniform Z-position, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may comprise first interconnect pads and second interconnect pads at a non-uniform Z-position, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation. As used herein, the phrases "A or B", "A and/or B", "one or more of A and B", and "at least one of A or B" means (A), (B), or (A and B).

Embodiments described herein include a substrate, comprising: first and second interconnect pads in or on a build-up layer, wherein the first interconnect pad is located at a lower position than the second interconnect pad with regard to a z-position; and first and second interconnects on the first and second interconnect pads.

Additional embodiments include a substrate, wherein the first and second interconnects comprise a conductive pillar, a solder ball, a copper core solder ball, or any combination thereof.

Additional embodiments include a substrate, wherein the first interconnect pad is located in the build-up layer and the second interconnect pad is located on the build-up layer.

Additional embodiments include a substrate, wherein the first interconnect pad is located closer to an edge of the build-up layer than the second interconnect pad.

Additional embodiments include a substrate, wherein a volume of a material used to form the first interconnect is different than a volume of a material used to form the second interconnect.

Additional embodiments include a substrate, wherein the volume of the material used to form the first interconnect is less than the volume of the material used to formed the second interconnect.

Additional embodiments include a substrate, wherein a stand-off height of the first interconnect is different than a stand-off height of the second interconnect.

Additional embodiments include a substrate, wherein the stand-off height of the first interconnect is less than the stand-off height of the second interconnects.

Additional embodiments include a substrate, wherein the substrate is a patch substrate, an interposer substrate, or a printed circuit board.

Additional embodiments include a substrate, wherein the substrate is cored substrate.

Additional embodiments include a substrate, wherein the substrate is a coreless substrate.

Additional embodiments include a substrate, further comprising: a third interconnect pad in the build-up layer, wherein the third interconnect pad is located at a lower Z-position than the second interconnect pad, and a higher Z-position than the first interconnect pad; and a third interconnect on the third interconnect pad.

Additional embodiments include a substrate, wherein the third interconnect pad is located closer to an edge of the build-up layer than the second interconnect pad, and further from the edge of the build-up layer than the first interconnect pad.

Embodiments described herein include an electronics package, comprising: a semiconductor die; and a patch substrate coupled to the semiconductor die, the patch substrate comprising: first interconnect pads in a build-up layer of the patch substrate; second interconnect pads on the build-up layer; and first and second interconnects on the first and second interconnect pads.

Additional embodiments include an electronics package, wherein an interposer substrate is coupled to the patch substrate by the first and second interconnects.

Additional embodiments include an electronics package, wherein a printed circuit board (PCB) is coupled to the interposer substrate.

Additional embodiments include an electronics package, wherein the electronics package is a server package.

Additional embodiments include an electronics package, wherein a PCB is coupled to the patch substrate by the first and second interconnects.

Embodiments described herein include a method for forming a substrate, comprising: forming recesses into a build-up layer; forming first interconnect pads in the recesses in the build-up layer; forming second interconnect pads on the build-up layer, wherein the first interconnect pads are located at a lower Z-position than the second interconnect pads; and forming first and second interconnects on the first and second interconnect pads.

Additional embodiments include a method, further comprising: forming first via openings below the recesses; and forming second via openings, wherein a depth of the second via openings is substantially the same as the combined depth of the recesses and the first via openings.

Additional embodiments include a method, wherein forming first and second interconnects on the first and second interconnect pads comprises: depositing a solder resist on the build-up layer and the first and second interconnect pads; creating solder resist openings (SROs) in the solder resist to reveal surfaces of the first interconnect pads and the second interconnect pads; depositing a surface finish on the surfaces of the first and second interconnect pads; and depositing a metallic material in the SROs on the surface finish to form the first and second interconnects.

Additional embodiments include a method, wherein one or more of the first and second interconnects comprise a conductive pillar, a solder ball, a copper core solder ball, or any combination thereof.

Additional embodiments include a method, wherein the first interconnect pad is located closer to an edge of the build-up layer than the second interconnect pad.

Additional embodiments include a method, further comprising: reflowing the first and second interconnects, wherein the reflown first and second interconnects couple the substrate to a second substrate.

Additional embodiments include a method, wherein the substrate is a patch substrate, and wherein the second substrate is an interposer.

What is claimed is:

1. A substrate, comprising:
   first and second interconnect pads in or on a build-up layer, wherein the first interconnect pad is located at a lower position than the second interconnect pad with regard to a z-position, wherein the first interconnect pad has an uppermost surface co-planar with an uppermost surface of the build-up layer, and wherein a portion of the second interconnect pad is on the uppermost surface of the build-up layer;
   a solder resist layer over the first and second interconnect pads, the solder resist layer on a portion of the uppermost surface first interconnect pad, and the solder resist layer on a portion of an uppermost surface of the second interconnect pad; and
   first and second interconnects on the first and second interconnect pads.

2. The substrate of claim 1, wherein the first and second interconnects comprise a conductive pillar, a solder ball, a copper core solder ball, or any combination thereof.

3. The substrate of claim 2, wherein the first interconnect pad is located in the build-up layer and the second interconnect pad is located on the build-up layer.

4. The substrate of claim 2, wherein the first interconnect pad is located closer to an edge of the build-up layer than the second interconnect pad.

5. The substrate of claim 2, wherein a volume of a material used to form the first interconnect is different than a volume of a material used to form the second interconnect.

6. The substrate of claim 4, wherein the volume of the material used to form the first interconnect is less than the volume of the material used to formed the second interconnect.

7. The substrate of claim 2, wherein a stand-off height of the first interconnect is different than a stand-off height of the second interconnect.

8. The substrate of claim 7, wherein the stand-off height of the first interconnect is less than the stand-off height of the second interconnects.

9. The substrate of claim 1, wherein the substrate is a patch substrate, an interposer substrate, or a printed circuit board.

10. The substrate of claim 1, wherein the substrate is cored substrate.

11. The substrate of claim 1, wherein the substrate is a coreless substrate.

12. The substrate of claim 1, further comprising:
    a third interconnect pad in the build-up layer, wherein the third interconnect pad is located at a lower Z-position than the second interconnect pad, and a higher Z-position than the first interconnect pad; and
    a third interconnect on the third interconnect pad.

13. The substrate of claim 12, wherein the third interconnect pad is located closer to an edge of the build-up layer than the second interconnect pad, and further from the edge of the build-up layer than the first interconnect pad.

14. An electronics package, comprising:
a semiconductor die; and
a patch substrate coupled to the semiconductor die, the patch substrate comprising:
first interconnect pads in a build-up layer of the patch substrate, wherein the first interconnect pads have an uppermost surface co-planar with an uppermost surface of the build-up layer;
second interconnect pads each having a portion on the uppermost surface of the build-up layer;
a solder resist layer over the first and second interconnect pads, the solder resist layer on a portion of the uppermost surface first interconnect pads, and the solder resist layer on a portion of an uppermost surface of the second interconnect pads; and
first and second interconnects on the first and second interconnect pads.

15. The electronics package of claim 14, wherein an interposer substrate is coupled to the patch substrate by the first and second interconnects.

16. The electronics package of claim 15, wherein a printed circuit board (PCB) is coupled to the interposer substrate.

17. The electronics package of claim 16, wherein the electronics package is a server package.

18. The electronics package of claim 14, wherein a PCB is coupled to the patch substrate by the first and second interconnects.

19. A method for forming a substrate, comprising:
forming recesses into a build-up layer; forming first interconnect pads in the recesses in the build-up layer;
forming second interconnect pads on the build-up layer, wherein the first interconnect pads are located at a lower Z-position than the second interconnect pad, wherein the first interconnect pads have an uppermost surface co-planar with an uppermost surface of the build-up layer, and wherein a portion of each of the second interconnect pads is on the uppermost surface of the build-up layer;
forming a solder resist layer over the first and second interconnect pads, the solder resist layer on a portion of the uppermost surface first interconnect pads, and the solder resist layer on a portion of an uppermost surface of the second interconnect pads; and
forming first and second interconnects on the first and second interconnect pads.

20. The method of claim 19, further comprising:
forming first via openings below the recesses; and
forming second via openings, wherein a depth of the second via openings is substantially the same as the combined depth of the recesses and the first via openings.

21. The method of claim 19, wherein forming first and second interconnects on the first and second interconnect pads comprises:
depositing a solder resist on the build-up layer and the first and second interconnect pads;
creating solder resist openings (SROs) in the solder resist to reveal surfaces of the first interconnect pads and the second interconnect pads;
depositing a surface finish on the surfaces of the first and second interconnect pads; and
depositing a metallic material in the SROs on the surface finish to form the first and second interconnects.

22. The method of claim 19, wherein one or more of the first and second interconnects comprise a conductive pillar, a solder ball, a copper core solder ball, or any combination thereof.

23. The method of claim 19, wherein the first interconnect pad is located closer to an edge of the build-up layer than the second interconnect pad.

24. The method of claim 19, further comprising:
reflowing the first and second interconnects, wherein the reflown first and second interconnects couple the substrate to a second substrate.

25. The method of claim 24, wherein the substrate is a patch substrate, and wherein the second substrate is an interposer.

* * * * *